United States Patent
Gudesen et al.

(10) Patent No.: US 6,841,818 B2
(45) Date of Patent: Jan. 11, 2005

(54) NON-VOLATILE MEMORY DEVICE UTILIZING DUETERATED MATERIALS

(75) Inventors: Hans Gude Gudesen, Brussels (BE); Per-Erik Nordal, Asker (NO)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/229,178

(22) Filed: Aug. 28, 2002

(65) Prior Publication Data

US 2003/0063499 A1 Apr. 3, 2003

Related U.S. Application Data

(60) Provisional application No. 60/333,742, filed on Nov. 29, 2001.

(30) Foreign Application Priority Data

Sep. 3, 2001 (NO) .......................................... 20014272

(51) Int. Cl.$^7$ ............................................... H01L 29/76
(52) U.S. Cl. ...................... 257/295; 365/65; 365/145; 365/149; 438/3
(58) Field of Search ........................... 257/295; 438/3; 365/145, 149, 201, 210, 65, 189.06, 189.08; 526/351; 525/231, 240; 527/231, 240

(56) References Cited

U.S. PATENT DOCUMENTS

| 3,303,177 A |  | 2/1967 | Natta et al. |  |
|---|---|---|---|---|
| 5,307,311 A | * | 4/1994 | Sliwa, Jr. ..................... | 365/174 |
| 6,449,184 B2 | * | 9/2002 | Kato et al. ................... | 365/145 |

FOREIGN PATENT DOCUMENTS

WO    WO 99/12170    3/1999

OTHER PUBLICATIONS

Patent Abstracts of Japan—Publication No. 61048983 A dated Oct. 3, 1986.
"Ultrafast Nonvolatile Ferroelectric Information Storage Data" IBM Technical Disclosure Bulletin, vol. 37 No. 11 Nov. 1994 pp. 421–424.
"Investigation of Switching Characteristics of Vinylidene Fluoride/Trifluoroethylene Copolymers in Relation to Their Structures", Y. Tajitsu, et al., Japanese Journal of Applied Physics, vol. 26, No. 4, Apr. 1987, pp. 554–560.
"Effects of Repeated Polarization Reversal on Polarization Properties in Vinylidene Fluoride Trifluorocthylene Copolymers" M. Date, et al, 1994 IEEE, pp. 668–673.
"Polarisation and Dielectric Properties of Fatigued Ferroelectric Polymer Films" L. L. Guy, et al., 10$^{th}$ International Symposium on Electrets, 1999 pp. 197–200.
Ferroelectric Properties of Form I Perdeuteriated Poly (vinylidene fluoride), Takase, et al. American chemical Society, 1987, vol. 20 pp. 2318–2320.
"Polymerization of Vinylidene-d$_s$ Fluoride", R.E. Cais, et al, Macromolecules, 1984, vol. 17, No. 9, pp. 1887–1889.
International Search Report dated Dec. 9, 2002 for International Appln. No. PCT/NO 02/00299.

* cited by examiner

Primary Examiner—David Nelms
Assistant Examiner—Long Tran
(74) Attorney, Agent, or Firm—Birch Stewart Kolach & Birch

(57) ABSTRACT

In a non-volatile memory device that includes an electrically polarizable dielectric memory material with ferroelectric or electret properties and capable of exhibiting hysteresis and remanence, wherein the memory material includes one or more polymers, at least one of these polymers is a deuterated polymer.

7 Claims, 3 Drawing Sheets

Figure 4A:
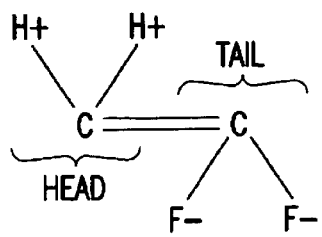

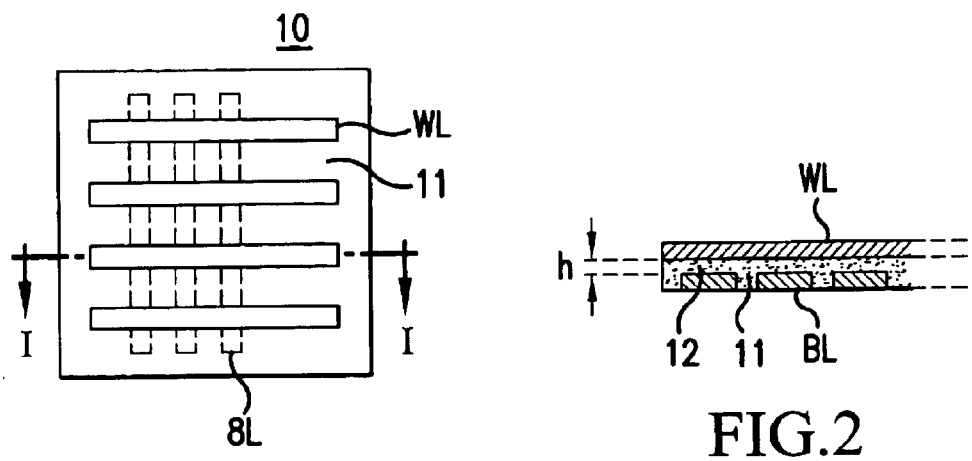
FIG.1
PRIOR ART
FIG.2
PRIOR ART
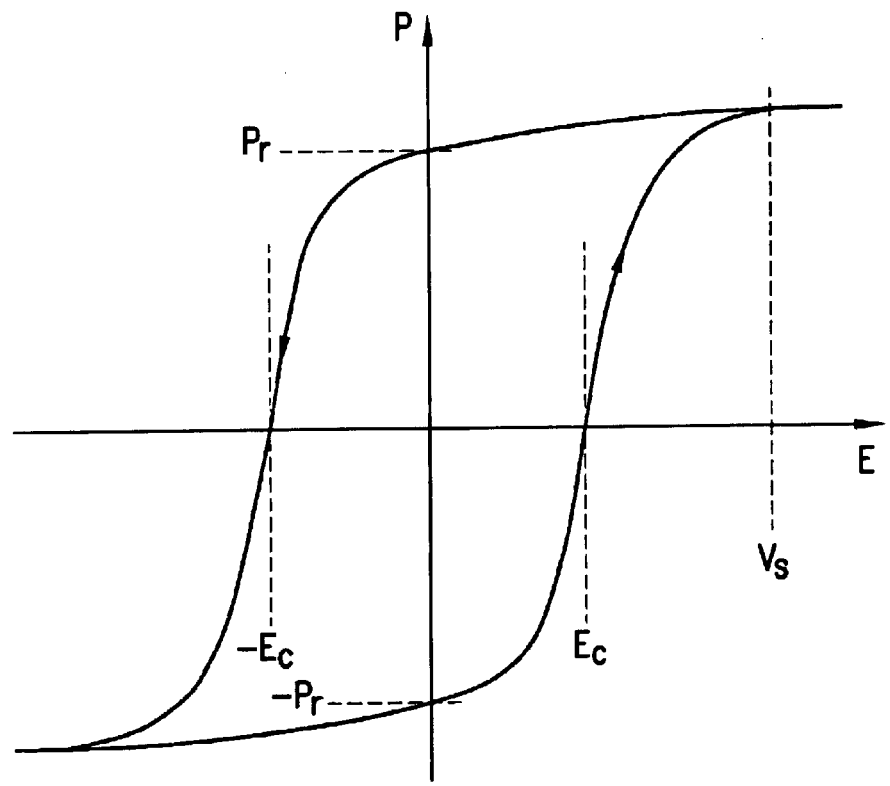
FIG.3

TAIL-TO-TAIL
DETECT

HEAD-TO HEAD
DETECT

NON-VOLATILE MEMORY DEVICE UTILIZING DUETERATED MATERIALS

This application claims the benefit of provisional application Ser. No. 60/333,742 filed Nov. 29, 2001.

The present invention concerns a non-volatile memory device comprising an electrically polarizable dielectric memory material with ferroelectric or electret properties and capable of exhibiting hysteresis and remanence, wherein the memory material comprises one or more polymers, wherein the memory material is provided in contact with a first set and a second set of respective electrodes for write, read and erase operations, wherein a memory cell with a capacitor-like structure is defined in the memory material direct or indirectly via the electrodes, wherein the memory cells in the memory devicand can be accessed e form the elements of an active or passive matrix, wherein each memory cell can be addressed selectively for a write/read operation establishing a desired polarization state in the memory cell or performing a polarization switching thereof, and wherein a definite polarization state established in the memory cell defines a logical state thereof.

FIG. 1 shows a prior art passive matrix memory device 10 of this kind. A first set of parallel strip-like electrodes WL is provided on a layer of memory material 11 and on the other side of the memory material a second set of strip-like electrodes BL is provided oriented orthogonally to the first set. The first set of electrodes WL forms word lines in the matrix memory and the second set of electrodes BL forms bit lines in the matrix memory.

FIG. 2 shows a section through the prior art matrix memory shown in FIG. 1. The electrode WL,BL sets are spaced apart and the memory material 11 is provided in sandwich therebetween. However, the electrode sets could also be provided embedded in memory material. In FIG. 2 the volume element in the memory material at the crossing between a word line and a bit line defines a memory cell in the memory material. The memory cell has capacitor-like structure. The ferroelectric (e.g.) memory material can be polarized to a definite polarization state by applying a voltage to a bit line and a word line thus establishing an electrical field across the ferroelectric memory material where the respective word line and bit line cross. The memory cell can store this polarization state indefinitely unless the polarization state is switched by once more applying an electric field to memory cell as will be explained below. The memory device 10 shown in FIGS. 1 and 2 is a so-called passive matrix memory device which means that there are no active switching elements provided in each memory cell of the memory device. However, it could also be realized as a so-called active memory device and then the memory cells are provided in the form of capacitors connected with a switching transistor and addressing takes place now not directly via the electrodes, but instead via connection established by switching the transistor via e.g. a separate driver or control line. Both passive and active matrices have advantages and disadvantages. A passive matrix is much more simple and the memory material may be provided in a global structure. It is a disadvantage that the memory cells in a passive matrix are not immune to crosstalk and sneak currents that arise in connection with an addressing operation. In an active matrix memory each cell comprises a discrete capacitor switched on by means of a switching transistor provided in the cell in order to cause it to be electrically coupled to word and bit lines in the matrix. Disadvantages here are higher cost, the need to provide discrete switching devices, i.e. the transistors and additional driving lines, and also a high current consumption.

Both passive and active matrix memory devices can be stacked to form volumetric data-storage devices. For instance could the passive matrix memory device in FIGS. 1 and 2 form a layer in a stacked structure with an insulating and/or separation layer being provided between each passive matrix memory device in the stack. In a ferroelectric or electret memory material exhibiting hysteresis the behaviour of the memory material will be addressed by referring to FIG. 3 which shows the hysteresis loop for a ferroelectric or electret material. The polarization of the material is shown with regard to the electric field E. The polarization value will move around the loop in an indicated direction. A ferroelectric material with a hysteresis loop as shown in FIG. 1 will change its polarization direction (switching) by applying an electric field E stronger than a so-called coercive electric field $E_c$. When the electric field E becomes greater than the electric coercive field $E_c$, the polarization P changes to a large positive value $+P_r$. This positive polarization $+P_r$ is maintained until a large electric field which has a value greater than the negative electric field $-E_c$, once again changes the polarization back to a negative polarization state. Hence memory devices with ferroelectric or electret capacitors exhibit a memory effect in the absence of an applied electric field and it will be possible to store non-volatile data by applying a potential difference across the memory material effecting a polarization response. The direction and the value of the polarization may hence be set and left in a desired state.

Passive matrix memories of the kind shown in FIG. 1 have been known in the art for a long time and reference may e.g. be made to JP patent publication 610498983 (deriving from JP application No. 59-170805 of Aug. 16, 1984) which discloses a ferroelectric high polymer thin film. This publication describes how a copolymer of vinylidene fluoride and trifluoroethylene is formed and used as a memory material in a passive memory device.

A number of polymers and copolymers have been shown to possess ferroelectric or electret properties and exhibiting switching phenomena which make them suitable for use as a memory material in matrix memory devices. For instance Tajitsu & al. in a paper titled "Investigation of Switching Characteristics of Vinylidene Fluoride/Trifluoroethylene Copolymers in Relation to Their Structures", (Japanese Journal of Applied Physics, Vol. 26:554 (1987)) present the switching characteristics of polyvinylidene difluoride-trifluoroethylene (PVDF-TrFE) copolymers and show their suitability for use as a memory material in a non-volatile matrix memory. Reference may also be made to IBM Technical Disclosure Bulletin, Vol. 37, No. 11 (November 1994) which discloses the use of ferroelectric polymers, particularly polyvinylidene difluoride (PVDF) or the copolymer PVDF-TrFE as the ferroelectric material which are capable of being deposited in very thin film and providing a very fast response to a pyroelectric stimulus. This publication is also relevant as it discloses the possibility of creating a stack of two-dimensional dimensional memory devices to form a volumetric data storage device.

A common problem with ferroelectric and/or electret polymers and copolymers is the occurrence of high level of chemical defects resulting in a low degree of crystallinity and consequently a low polarization potential. This has also a negative effect on the switching behaviour. The switching may for instance become slower and require a very high field voltage. Polyvinylidene difluoride (PVDF) is generally regarded as less suitable as memory material, as it tends to form a non-polar crystal structure and the PVDF must then usually be mechanically stretched to render it ferroelectric, i.e. converting the crystals from the non-polar form (II) to the polar form (I). The stretching procedure, however, is not compatible with a typical CMOS processing used in the production of a memory chip, while the ferroelectric polymer will have to be deposited on a rigid silicon wafer, thus preventing this kind of mechanical processing afterwards.

An advantageous ferroelectric polymer memory material would be the copolymer PVDF-TrFE. This copolymer crystallizes naturally into a polar phase such that no mechanical stretching is required to render it ferroelectric. However, the combination of TrFE with the PVDF does not prevent the occurrence of chemical defects, so-called head-to-head or tail-to-tail defects which negatively affect the ferroelectric properties. If these chemical defects could be reduced, then ferroelectric polymers would be much better candidates for use as memory materials in nonvolatile memories.

Another detrimental effect, particularly in ferroelectric polymers, is the so-called fatigue which influences their switching behaviour adversely. Fatigue occurs upon repeated switching of a memory cell and this is particularly unfortunate when ferroelectric polymers shall be employed in, say ferroelectric random access memories (FERAM), where a very high switching endurance is desired. Such devices should be able to sustain a number of repeated switching cycles running into millions or billions without the switching behaviour being appreciably affected. This is, however, not the case as repeated switching tends to lower the polarization potential and increasingly higher field voltage must be applied to induce switching. Also the detection of the polarization state becomes more difficult as the current output response becomes increasingly lower and in the long run approaches a discrimination limit. The reason for the undesirable fatigue phenomena in ferroelectric polymers has been related to a charge build-up on the electrodes particularly due to a defluorination or dehydrofluorination of the polymer chains yielding carriers of mobile charges in the memory medium, e.g. fluorine and hydrogen fluoride.

Hence a primary object of the present invention is to provide a non-volatile matrix memory with a ferroelectric or electret polymer or copolymer memory material not encumbered with the above-mentioned deficiencies and with improved functional properties, particularly in non-volatile passive matrix memories.

The above-mentioned objects as well as other features and advantages are obtained with a memory device according to the invention, which is characterized in that the ferroelectric or electret memory material comprises at least one deuterated polymer.

In a first advantageous embodiment of the invention said at least one deuterated polymer is polyvinylidene difluoride (PVDF).

In another advantageous embodiment of the invention said at least one deuterated polymer is a copolymer, and the copolymer may then preferably be polyvinylidene difluoride-trifluoroethylene copolymer.

In yet another advantageous embodiment of the invention said at least one deuterated polymer is a terpolymer.

In embodiments of the invention said at least one deuterated polymer is only partly deuterated; preferably is then the atomic percentage of deuterium at least 99%, the remainder being protonic hydrogen.

Figure 4B:
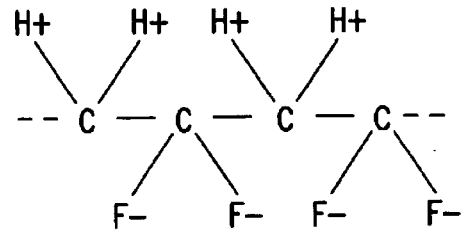
Figure 5A:
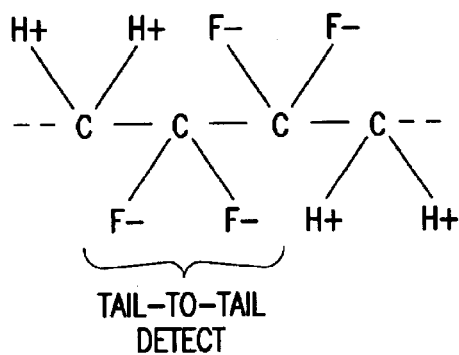
Figure 5B:
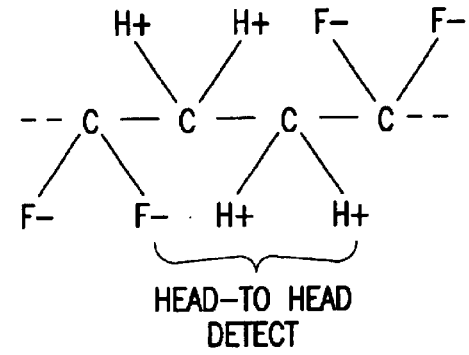
Figure 6A:
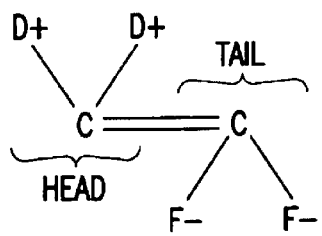
Figure 6B:
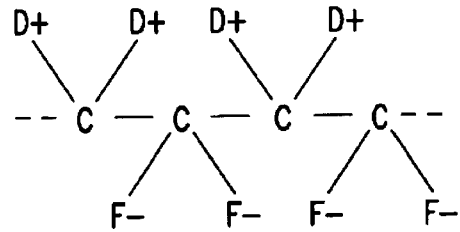
Figure 7:
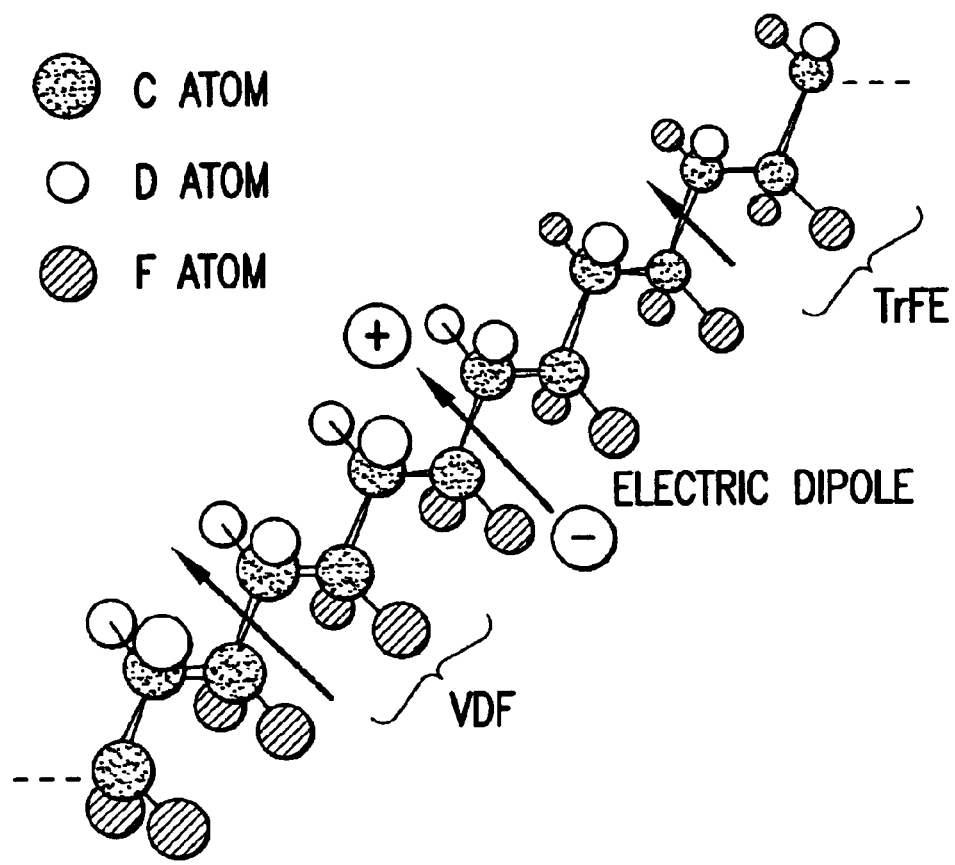

The invention shall now be explained in more detail to facilitate a better understanding of the advantages gained, principles involved and with appropriate reference to the drawing figures, wherein FIG. 1 shows schematically a prior art passive matrix memory as already mentioned, FIG. 2 is a section taken along the line A—A of FIG. 1, FIG. 3 is a standard hysteresis loop for a ferroelectric or electret polymer memory material, FIG. 4a shows schematically the structure of a regular protonated vinylidene difluoride monomer, FIG. 4b shows schematically the structure of a polymer chain of protonated vinylidene difluoride monomers, FIG. 5a is an example of a defect occurring in protonated polyvinylidene difluoride polymer chains, FIG. 5b is another example of a defect occurring in the same compound as in FIG. 5a, FIG. 6a shows schematically the structure of a deuterated vinylidene difluoride monomer, FIG. 6b shows schematically the structure of a polymer chain of deuterated vinylidene difluoride monomers, and FIG. 7 is a stereometric view of a copolymer chain of vinylidene difluoride and trifluoride ethylene monomers as used with the present invention.

The present invention proposes a non-volatile memory with ferroelectric or electret polymers as the memory material, but wherein the memory material comprises deuterium in place of hydrogen in the polymer chains. Although deuterated polymers have been described and their properties to some extent have been investigated; see e.g. U.S. Pat. No. 3,303,177 (Natta & al.) of 7 Feb. 1967 which shows polymer chains with isotactic stereoregularity obtained with use of respectively both deuterated and tritiated monomers of methyl ethylene; Cais & Kometani, "Polymerization of Vinylidene-$d_2$ Fluoride. Minimal Regiosequence and Branch Defects and Assignment of Preferred Chain-Growth Direction from the Deuterium Isotope Effect", Macromolecules, 17:1887–89 (1984); and Takase & al., "Ferroelectric Properties of Form I Perdeuteriated Poly (vinylidene fluoride)", Macromolecules, 20:2318–20 (1987)), they have never been proposed as candidate materials for non-volatile memories with ferroelectric or electret polymer memory materials.

FIG. 1 shows as mentioned above very schematically a preferred passive matrix memory with a first set of electrodes comprising word lines WL and a second set of electrodes comprising bit lines BL in the passive matrix memory. The electrode sets are arranged around a very thin layer of a ferroelectric or electret polymer or copolymer memory material 11, wherein the polymer or copolymer is deuterated, i.e. having the hydrogen atoms in the polymer chain replaced by deuterons. The section in FIG. 2 taken along the line A—A in FIG. 1 shows the thin-film memory material provided in sandwich between the word line electrodes WL and the bit line electrodes BL. Typically the thickness of the thin-film memory material will be less than 1 μm, preferably considerably less, e.g. down to the thickness of a molecular monolayer. The set of word line electrodes WL and the set of bit line electrodes BL are located in parallel planes sandwiching the memory material 11 therebetween and at the crossing between a word line WL and a bit line BL there is defined a memory cell 12 in the form of a capacitor-like structure. Upon the application of electric field the memory material in the cell will be polarized and exhibit hysteresis given by the hysteresis loop in FIG. 3, where the applied electric field E is shown along the x axis and the polarization P along the y axis, while $-E_c$ and $+E_c$ respectively are the coercive fields and $+P_r$ and $-P_r$ respectively the remanent polarization. The switching voltage is denoted by $V_s$ and if, say a memory cell initially is in its remanent polarization state $-P_r$ the application of positive switching voltage $V_s$ shall reverse the polarity of the memory cell, driving the polarization along the hysteresis loop as indicated until saturation is reached at the upper cusp of the hysteresis loop whereafter the polarization in absence of an applied electric field now drifts to the stable positive remanent polarization $P_r$.

Phenomena and operations in connection with charging, switching and addressing ferroelectric protonated polymer materials have been amply discussed in available literature and are well understood by persons skilled in the art. Similar considerations shall apply to the charging, switching and addressing behaviour of ferroelectric deuterated polymer and copolymer materials and hence these features need not be further discussed here.

As known in the art ferroelectric memory devices of the matrix type may be stacked to form a three-dimensional or volumetric data storage apparatus. In the present case could e.g. two or more, as a matter of fact a plurality of memory devices according to the invention, e.g. similar to the one shown in FIG. 1, be stacked to form a volumetric data storage apparatus either with one electrode set in each device being shared by the following device or with electrically insulating layers of separation layers between the devices forming the stack as appropriate. The memory device according to the invention or a stack thereof will be provided of a substrate that either may be rigid, e.g. made of silicon, or flexible, e.g. made of plastics or metal foils. In the former case circuitry for control and driving purposes, e.g. with silicon transistors, could be provided in the substrate, but control and driver circuitry could also be made comprising thin-film transistors which then could be inorganic or organic and located in the memory device itself, e.g. at the edges of the device outside the memory area or in additional layers of each memory device and in any case integrated therewith.

Polyvinylidene difluoride (PVDF) is the best known and most well-tried ferroelectric polymer material. Its monomer form $CH_2=CF_2$ is shown in FIG. 4a. The protonated group at left is called the head and the fluorinated group at right is called the tail of the monomer, while the carbon atoms, of course, form a double bond. The polymer polyvinylidene difluoride (PVDF) is shown in FIG. 4b and the monomer groups now link up with each carbon atom forming single bonds with neighbouring atoms resulting in a polymer chain. Defects commonly occurring in as much as 6% of the PVDF are shown in FIG. 5, of which FIG. 5a shows a so-called tail-to-tail defect where the tail group in a monomer occurs in the head position of the adjoining monomer, while FIG. 5b shows a head-to-head defect wherein the head group of the monomer now is linked with the head group of the adjoining monomer. Both these defects have adverse consequences for the use of PVDF as a memory material.

However, a far better regularity of the polymer chains and a greatly reduced frequency of chain branching are achieved in deuterated PVDF, wherein the protons now have been replaced by deuterons, resulting in a monomer structure as shown in FIG. 6a, where the head group comprises deuterons. This of course, results in a regular PVDF as shown in FIG. 6b, which is structurally similar to the protonic PVDF in FIG. 4b, but with the former offering superior properties as a memory material in important respects. Deuterated PVDF actually offers the possibility of being applied as a ferroelectric memory material, whereas the copolymer PVDF-TrFE usually has been preferred over PVDF in its protonic form.

Similarly, in the memory device according to the present invention the deuterated form of the copolymer PVDF-TrFE (polyvinylidene difluoride trifluoroethylene) constitutes a preferred embodiment. FIG. 7 shows a stereometric view of the molecular structure of deuterated PVDF-TrFE and with one of each respective monomers VDF and TrFE particularly indicated. This structure is similar to the protonated structure, but with deuterons in place of the protons everywhere in the copolymer chain. In addition FIG. 7 shows the electric dipoles and their orientation perpendicular on the molecular axis and originating from the large difference in the electron affinity of D and F atoms. The synthesis of deuterated copolymer PVDF-TrFE can start with synthesis of the deuterated monomers, whereafter the monomers are combined in the polymerization step.

In connection with the use of deuterated polymers, they may as a memory material in the memory device according to the invention be used singly as a copolymer, or as blends of polymers and copolymers, or alternatively combined to form blends including various additional compounds.

For a general overview of the properties of PVDF as one of the best understood and most typical ferroelectric polymers reference may be made to Nalwa (editor), Ferroelectric Polymers, Ch. 3, pp. 183–232 and Ch. 4, pp. 233–261 (Marcel Dekker, Inc. (1995)). Also G.M. Sessler, Electrets, Vol. 1, Introduction and Section 8.5.1 to 8.5.4 (pp. 407–411) (Laplacian Press (1998)), provides in the context of the present application relevant discussions of the properties of PVDF, as well as copolymers and blends therewith.

Synthesis of deuterated polymers takes place along the line for the comparable protonated polymers. As disclosed by Cais & Kometani (op. cit.) perdeuterated monomer $VF_2$-$d_2$ can be synthesized from trifluoroethanol-$d_3$ with a minimum atomic deuteron percentage of 99%. This compound was reacted with p-toluensulfonic acid and the ester derivate then treated with sodium iodide to liberate $CF_3CD_2I$. The purified $CF_3CD_2I$ was dropped slowly onto Mg and ether and the evolved $CD_{2\ =CF2}$ were collected and transferred to a vacuum line where it was degassed by freeze-thawing and distilled. Polymerization now can take place by using trichloracetyl peroxide as initiator, said initiator being prepared from trichloracetyl chloride and sodium peroxide according to standard procedure. The monomer was dissolved in 1,2-dichlorotetrafluoroethane and evaporated to dryness at −80° C. The monomer was condensed at −196° C. in a tube which was sealed and thereafter rapidly heated to the polymerization temperature of 0° C. in a pressurized reactor held in an ice water bath. After a suitable polymerization time had elapsed the tubes were frozen in liquid nitrogen and opened. The recovered PVDF polymers were extracted with acetone to remove initiator residues and possible traces of oligomer and then dried in a vacuum oven.

An investigation of the ferroelectric properties of deuterated PVDF shows a significant improvement over the protonated PVDF. It was found that deuterated polymer has a much higher degree of crystallinity and hence allow a much higher remanent polarization value. This improves the switching properties of the deuterated polymer as a memory material, due to the high degree of net dipole orientation along the surface normal of the memory material that is obtained in the form of a thin film. Also the switching characteristics improve owing to the deuterated polymer having a more perfect crystalline structure. The advantageous crystallinity results in a higher and more sharply defined melting temperature of the deuterated PVDF and tends to give its hysteresis loop a more square shape. In the deuterated copolymer PVDF-TrFE the Curie temperature increases and hence its operational temperature range, as the transition from pure ferroelectric behaviour to paraelectric behaviour, of course, occurs at the Curie point. Deuterated polymer has the additional advantage of being much less susceptible to detrimental defluorination and the dehydrofluorination of the polymer chain and this in its turn implies an increased fatigue resistance when used as memory material. In other words, a very large number of switching cycles will not adversely affect the switching behaviour and polarization values of a deuterated polymer, as is the case of prior art ferroelectric or electret polymers and discussed in the introduction of the application.

Finally deuterated ferroelectric polymers have a lower dielectric constant at high frequency than their protonated counterparts, and this implies a reduction of capacitive couplings and crosstalk particularly in passive matrix memory devices where the matrix is very large, i.e. has a large number of memory cells. The conclusion is that non-volatile matrix memories, particularly of the passive kind, with a deuterated ferroelectric or electret polymer or copolymer according to the invention, show a significant improvement in performance as compared with the prior art matrix memory devices using protonated ferroelectric or electret polymers or copolymers.

It appears from prior art that also tritiated polymers have less defects and improved isostatic stereoregularity. In contrast with deuterated polymers, tritiated polymers, which otherwise could be regarded as equivalents, are less topical as ferroelectric memory materials for reasons of costs and practical considerations.

A number of candidate polymer and copolymer materials in their deuterated form are presently being considered by the applicant as a replacement for protonated polymer memory materials. While deuterated PVDF or deuterated PVDF-TrFE presently appears to be strong candidate materials, this does not preclude that a lot of other polymers and copolymers with hydrogenatoms in their chains are easily amenable to similar synthesis procedures as described above, yielding a ferroelectric or electret polymer memory medium for the memory device according to the invention, but with deuterons replacing protons everywhere in the polymer or copolymer chains, with the resulting improvement in switching performance and data storage properties.

What is claimed is:

1. A non-volatile memory device comprising:

an electrically polarizable dielectric memory material with ferroelectric or electret properties and capable of exhibiting hysteresis and remanence, wherein the memory material comprises one or more polymers, wherein the memory material is provided in contact with a first set and a second set of respective electrodes for write, read and erase operations, wherein a memory cell with a capacitor-like structure is defined in the memory material and can be accessed direct or indirectly via the electrodes, wherein memory cells in the memory device form the elements of an active or passive matrix, wherein each memory cell can be addressed selectively for a write/read/erase operation establishing a desired polarization state in the memory cell or performing a polarization switching thereof, wherein a definite polarization state established in the memory cell (12) defines a logical state thereof, and wherein the ferroelectric or electret memory material (11) includes at least one deuterated polymer.

2. A memory device according to claim 1, wherein said at least one deuterated polymer is polyvinylidene difluoride (PVDF).

3. A memory device according to claim 1, wherein said at least one deuterated polymer is a copolymer.

4. A memory device according to claim 3, wherein the copolymer is polyvinylidene difluoridetrifluoroethylene copolymer.

5. A memory device according to claim 1, wherein said at least one deuterated polymer is a terpolymer.

6. A memory device according to claim 1, wherein said at least one deuterated polymer is only partly deuterated.

7. A memory device according to claim 6, wherein the atomic percentage of deuterium is at least 99%, the remainder being protonic hydrogen.

* * * * *